United States Patent [19]

Canclini

[11] Patent Number: 5,223,737
[45] Date of Patent: Jun. 29, 1993

[54] ELECTROSTATIC DISCHARGE PROTECTION DEVICE FOR AN INTEGRATED CIRCUIT PAD AND RELATED INTEGRATED STRUCTURE

[75] Inventor: Athos Canclini, Como, Italy

[73] Assignee: SGS-Thomson Microelectronics s.r.l., Milan, Italy

[21] Appl. No.: 812,190

[22] Filed: Dec. 20, 1991

[30] Foreign Application Priority Data

Dec. 21, 1990 [EP] European Pat. Off. ........ 90830611.1

[51] Int. Cl.$^5$ ...................... H01L 29/06; H01L 29/90
[52] U.S. Cl. .................................. 257/546; 257/362; 257/363; 257/603
[58] Field of Search ............... 357/23.13, 13; 257/362, 257/363, 546, 603

[56] References Cited

U.S. PATENT DOCUMENTS

| | | | |
|---|---|---|---|
| 4,897,757 | 1/1990 | Tailliet et al. | 357/23.13 |
| 5,077,591 | 12/1991 | Chen et al. | 357/23.13 |

FOREIGN PATENT DOCUMENTS

| | | |
|---|---|---|
| 3636829A1 | 5/1987 | Fed. Rep. of Germany . |
| 57-136356 | 11/1982 | Japan . |
| 62-81048 | 9/1987 | Japan . |
| 2127214A | 4/1984 | United Kingdom . |

OTHER PUBLICATIONS

Patent Abstracts of Japan, vol. 13, No. 259, Jun. 15, 1989 #A 155017, Published Feb. 3, 1989 Whole document.

*Primary Examiner*—Gene M. Munson
*Attorney, Agent, or Firm*—Seed and Berry

[57] ABSTRACT

A circuit for protection from overvoltages of an external electrical connection pad of a circuit integrated in an n type conductivity epitaxial layer formed on a monocrystal semiconductor substrate, comprises a lateral integrated transistor having an emitter connected to said pad, a collector connected to ground and a base connected to said pad across a resistor, and an integrated Zener diode functionally connected between the base and the collector of said transistor.

20 Claims, 3 Drawing Sheets

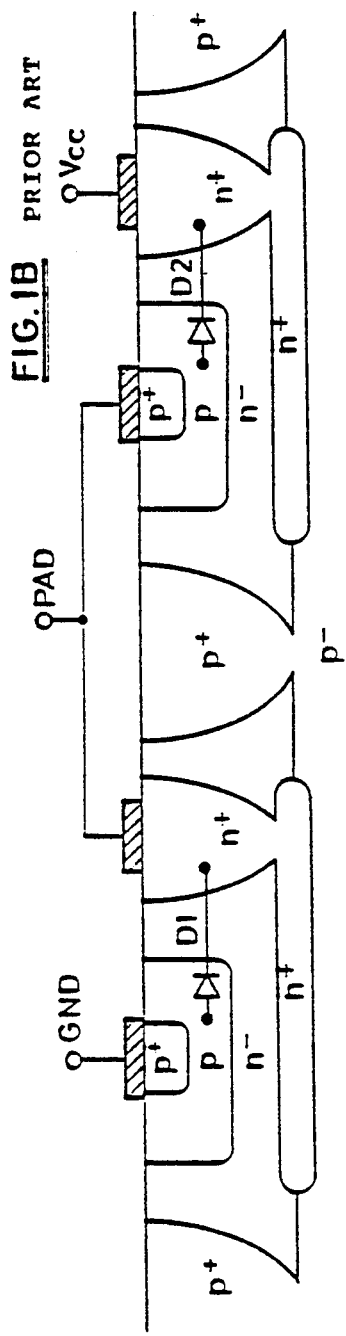
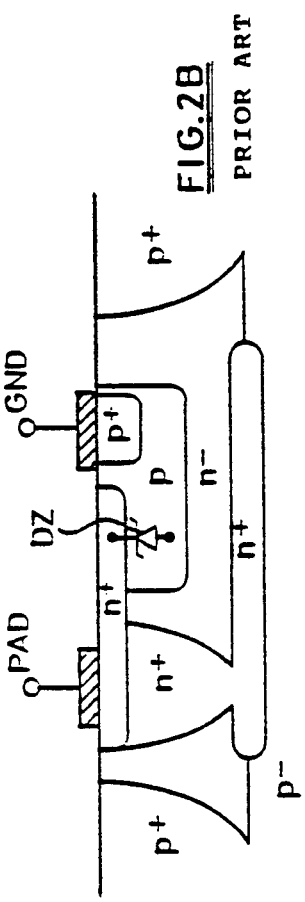
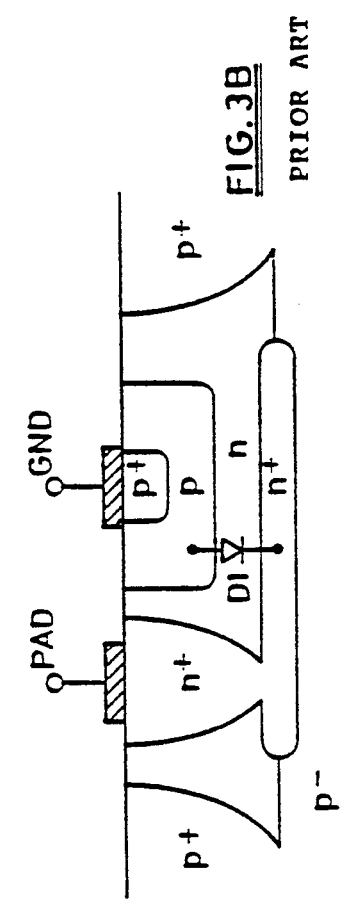
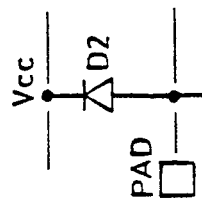
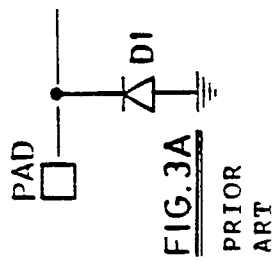

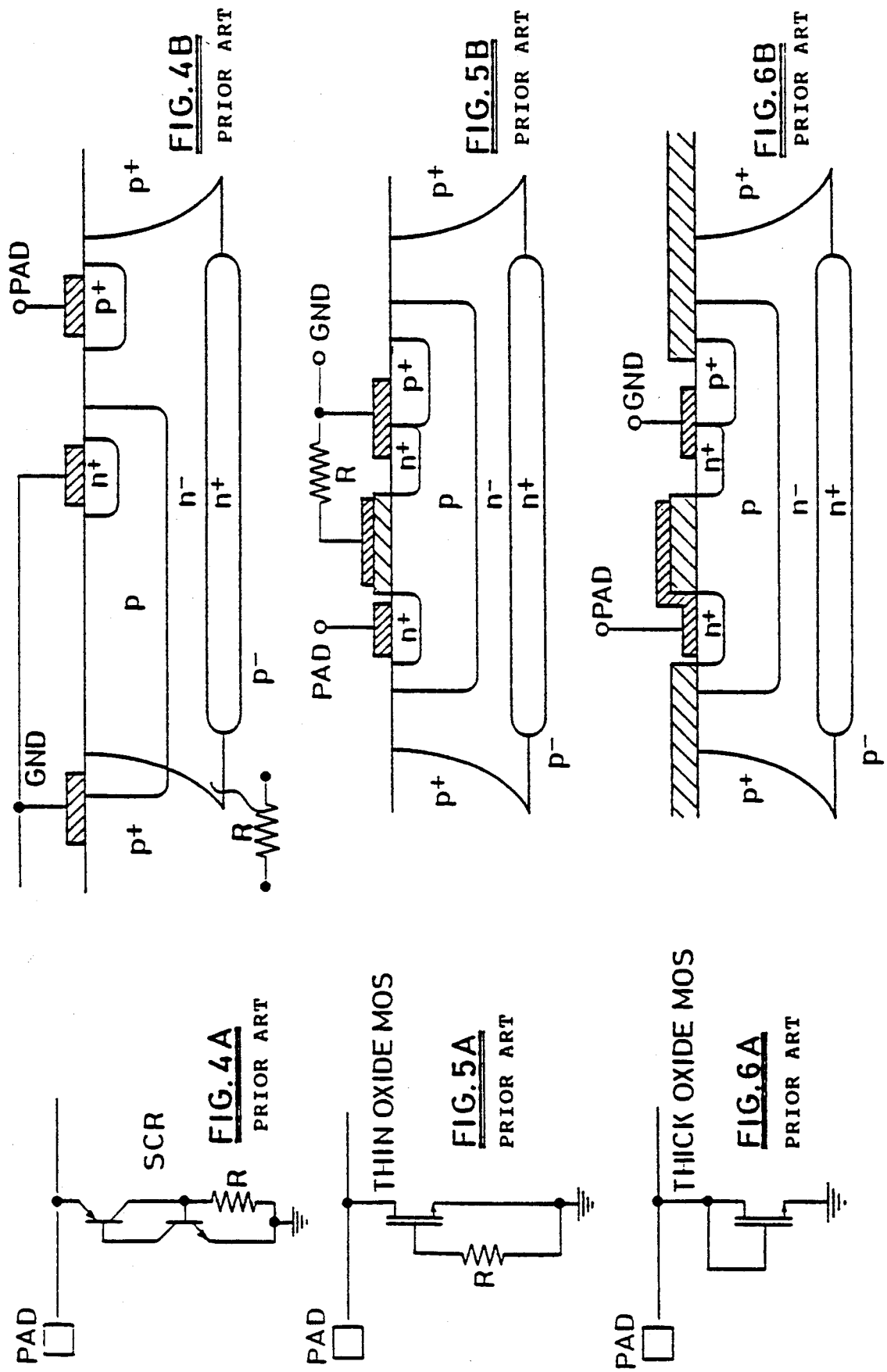

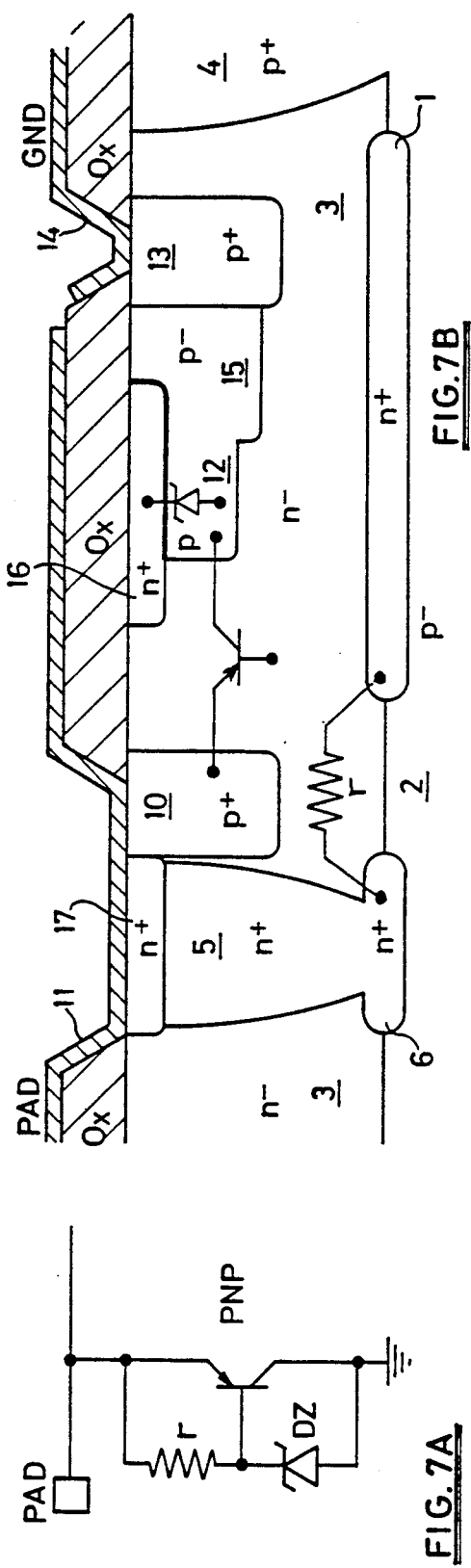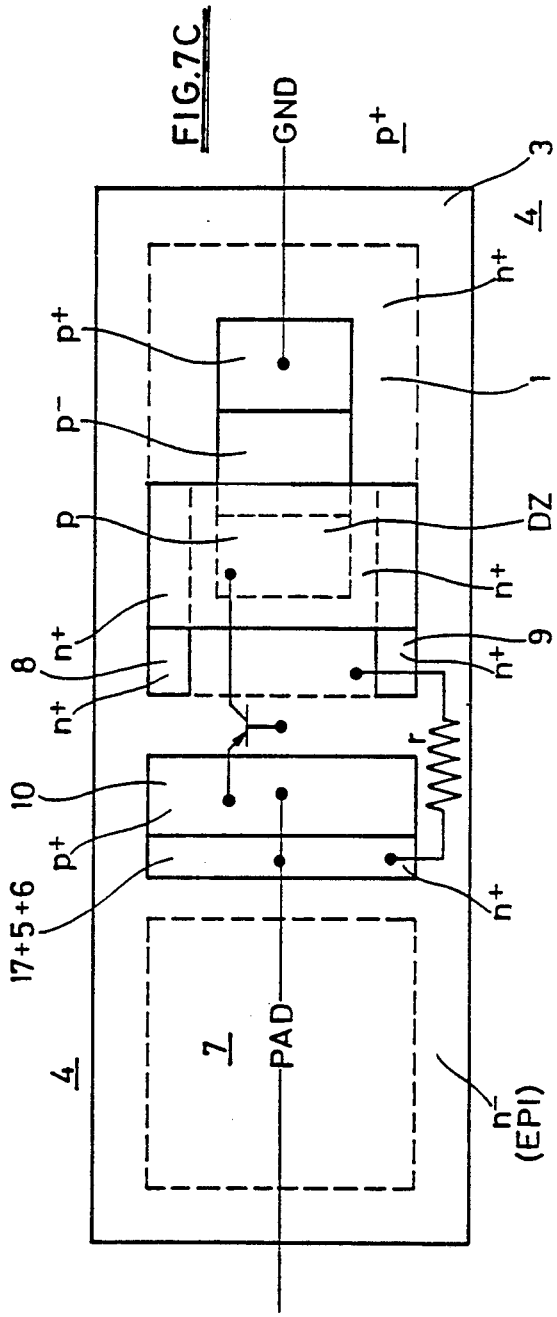
FIG.7A
FIG.7B
FIG.7C

ELECTROSTATIC DISCHARGE PROTECTION DEVICE FOR AN INTEGRATED CIRCUIT PAD AND RELATED INTEGRATED STRUCTURE

DESCRIPTION

1. Field of the Invention

The present invention relates to devices for protection from electrostatic discharges brought about by tribological or other kinds of effects, for an integrated circuit.

2. Background of the Invention

One of the most used quantitative criteria for evaluating the sensitivity of an integrated circuit to electrostatic discharges, is the connecting of each pin to a suitable discharge circuit, keeping the ground pins of the integrated circuit connected to ground. Characteristic of an electrostatic discharge (ESD) is the passage of a very high current for a very short period of time. The most used discharge model is the so-called "human body model" (HBM) consisting of a 100 pF capacitor connected up to a 1.5 KΩ resistor in turn connected up to the pin under test. If the discharge circuit in the chip has an impedance much lower than 1.5 KΩ, the current decays exponentially with a time constant $\tau = 150$ ns.

The electrostatic discharge has various effects on junctions and gate oxides. The critical factor of a junction is the energy dissipated during the discharge, which produces therein a heating under quasiadiabatic conditions. The temperature increase which is derived therefrom can locally be hundreds of degrees and produce melting of the metal of a metallization layer close to the junction, as well as the formation of defects and/or the migration of dopants which alter the electrical characteristics of the relevant integrated structures, if not actually causing their destruction.

An essential element of an ESD protection system is a device able to conduct the entire discharge current without being damaged. The voltage reached by the respective "pad" during the discharge must not exceed a maximum limit beyond which junctions of the integrated circuit downstream (protected circuit) could be liable to breakdown.

SUMMARY OF THE INVENTION

The purpose of the present invention is to provide a circuit and a related integrated structure for electrostatic discharge protection for a pin, that is to say for an external electrical connection pad of an integrated circuit, which overcomes many of the drawbacks and shortcomings of the protection devices of the prior art.

The circuit of the invention includes a lateral integrated transistor having an emitter connected to the pad under protection, a collector connected to ground and a base connected to same pad across a resistor, and an integrated Zener diode functionally connected between the base and the collector of said integrated transistor. The various aspects and advantages of the invention will be more easily seen through the following detailed description of a preferred embodiment of the invention and through reference to the attached drawings.

BRIEF DESCRIPTION OF THE DRAWINGS

FIGS. 1A-1B to 6A-6B represent a known prior art circuits and the respective integrated structures for protection according to the prior art;

FIG. 7A is an electrical diagram of a protection device embodied according to the present invention;

FIG. 7B is a partial section of an integrated circuit which shows the integrated structure of the protection device according to the electrical diagram illustrated in FIG. 7A;

FIG. 7C is a partial schematic plan view of the integrated structure of FIG. 7B.

DESCRIPTION OF THE PREFERRED EMBODIMENT

Numerous ESD protection circuit devices are known and a review of these known circuits is shown in the series of FIGS. from 1A1B to 6A6B, where the first figure (A) of each pair of figures is a circuit diagram of the protection device while the second figure (B) of each pair shows the related integrated structure.

Each of these known protection devices exhibits some drawbacks.

The protection structure of FIGS. 1A-1B requires connection to the (d.c.) supply. This may be impossible in the case of pins which, for reasons of functioning of the integrated circuit, must be brought to voltages greater than the supply voltage itself. The resistance to the positive discharge depends in large measure on the protected circuit itself, that is to say the discharge path is often unpredictable and dangerous.

The device illustrated in FIGS. 2A and 2B exploits the Zener effect between a shallow and heavy n+ diffusion and a relatively light p diffusion. Breakdown under discharge conditions is localized in the cylindrical region of the junction with consequent concentration of current in a shallow diffusion, strongly concentrated in a restricted area of the junction itself (curved zone). This can bring about the perforating of the junction by molten aluminum "spikes" growing in the vertical direction or, given the shallowness of this junction, in the horizontal direction, by the electrothermal migration effect of the aluminum of the metallization (Zener zapping). In practice, this device is highly suited to absorbing the discharge current, but on the other hand possesses meagre resistance against the discharge itself.

In a so-called BCD process (integration of bipolar, CMOS and DMOS structures on the same chip), the commonly used protection structure is a basecollector diode, D1. This device, though more robust than the device of FIGS. 2A2B, exhibits a relatively high clamp voltage (basecollector breakdown) and in general various junctions of the protected circuit can be liable to begin to break down before the protection diode can begin functioning.

The device of FIGS. 4A and 4B uses an SCR structure, which only admits very high currents, typical of electrostatic discharge phenomena. The disadvantages of this protection structure are represented by the fact that in BCD integrated circuits, there can exist pins connected to supply voltages across which there can functionally pass currents at strengths comparable to or greater than a discharge current itself. A voltage spike on such a pin would produce the irreversible triggering of the SCR (latching); the structure exhibits a relatively high clamp voltage on triggering, even if such voltage subsequently becomes very low, hence the presence in the circuit under protection of junctions liable to break down at a lower voltage than the triggering clamp voltage prevents the protection device from intervening; moreover, the device does not protect against the negative discharge.

The device shown in FIGS. 5A and 5B exploits the triggering of the lateral npn transistor associated with an NMOS transistor, in which the gate connected to ground acts as a fieldplate in order to reduce the breakdown voltage. The disadvantage of this solution is represented by the degradation of the gate oxide due to the injection of hot carriers into the avalanche region, and moreover the latter does not protect against the negative discharge.

The protection structure shown in FIGS. 6A and 6B exploits the formation of an inverted channel caused by the raising of the gate voltage on account of the fact that the gate is, in this integrated structure, represented by the metallization layer present on a thick oxide layer. The disadvantage essentially consists of the high clamp voltage, due to the thickness of the oxide under the metal and of the fact that the structure does not protect against the negative discharge.

A preferred implementation of the invention is shown in FIGS. 7A, 7B and 7C, in which is represented a typical application of the protection device of the invention to a pad of a circuit, integrated in an $n^-$ type epitaxial layer formed on a monocrystal semiconductor substrate (commonly having a $p^-$ type conductivity). This in fact represents the type of semiconductor substrate most widely used to fabricate integrated circuits and in particular to fabricate so-called BCD type integrated circuits (containing bipolar, CMOS and DMOS structures integrated on the same monolithic substrate). Naturally, as will clearly be apparent to the expert, the protection device of the invention can be embodied in a circuit, integrated into a p type conductivity epitaxial layer, by inverting all conductivities and polarities of the respective circuit nodes (and the direction of the currents).

Referring to FIGS. 7A, 7B and 7C, the circuit device for protecting a pad essentially comprises a pnp transistor having the emitter connected to same pad, the collector connected to ground and a base connected to same pad across a resistor r, and a Zener diode DZ functionally connected between the base and the collector of the transistor.

The embodiment of the integrated protection structure is shown in FIGS. 7B and 7C. This structure is composed of an $n^+$ type buried layer formed at the interface between the $p^-$ type conductivity semiconductor monocrystal 2 and an $n^-$ type conductivity epitaxial layer 3, in an area at a certain distance from the projection of the area of the pad. The entire region of formation of the protection structure is conventionally isolated by a deep isolating diffusion 4 having a $p^+$ type conductivity.

A first deep diffusion (sinker) region 5 having an $n^+$ type conductivity, formed in an intermediate zone between the distance which separates the projection of the area occupied by the pad onto the face of the device and the edge of the buried layer 1, extends substantially from the surface of the epitaxial layer 3 to the interface between the same epitaxial layer and the monocrystal substrate 2. As shown in FIG. 7B, a second $n^+$ type buried layer 6 can optionally be formed at the base of the deep diffusion 5.

Similar $n^+$ type conductivity deep diffusion (sinkers) regions are formed along the two opposite sides of the buried layer 1, substantially orthogonal relative to the side turned towards the (projected) area of the pad 7; the profile of the horizontal section of these two further $n^+$ type deep diffusion regions are indicated, with 8 and 9 respectively, in the schematic plan view of FIG. 7C.

A first $p^+$ type conductivity diffused region 10 formed adjacent to the $n^+$ region 5 along the side turned toward the buried layer 1, constitutes the emitter region of a lateral pnp transistor and is contacted, together with region 5, by the metallization layer 11 of the pad.

Laterally separated, there is formed a p type conductivity diffused region 12 (e.g. p body), which constitutes the collector region of the lateral pnp transistor, the base region of which is constituted by the n type epitaxial layer 3. The collector region 12 can extend laterally up to a $p^+$ type conductivity collector contact region 17, which region is contacted by a ground metallization layer 14 of the integrated circuit. Preferably, as shown in the illustrated embodiment, a third $p^-$ type conductivity intermediate region 15 is formed between the collector region 12 and the collector contact region 13, for purposes which will be specified subsequently.

An $n^+$ type conductivity superficial diffusion region 16 formed by inverting the type of conductivity on at least a superficial portion of the diffusion 12 and also possibly of the region 15 to form an $n^+/p$ Zener junction, extends laterally so as to overlap the two $n^+$ type sinker regions, 8 and 9 respectively (the profile of which is visible in the plan view of FIG. 7C). In this way, a conductive path is produced between same $n^+$ type region 16 across the two $n^+$ type deep diffusion regions 8 and 9, the $n^{30}$ type buried layer 1, the $n^{30}$ type region 6 at the base of region 5, and the metallization layer 11 of the pad, which conductive path intentionally comprises a resistive portion in the $n^-$ conductivity epitaxial layer zone devoid of buried layer which constitutes the resistor r of the circuit of FIG. 7A. Optionally, as shown in FIG. 7B, a similar $n^{30}$ type superficial diffusion can also be produced at the top of the deep diffusion region 5, as shown in the figure with 17.

The function of the device will now be described. During a positive discharge which may accidentally hit the external pin connected to the pad illustrated in the figures, the injected current charges the capacities connected to the epitaxial pocket 3, making the potential thereof increase. The $n^+$ type shallow diffusion 16 is electrically connected to the pad, whilst the underlying p type diffusion (p body) 12 is connected to ground. The voltage of the pad 11 ceases to increase when it reaches the breakdown voltage of the planar zone of the $n^+/p$ body junction between the regions 16 and 12. This breakdown voltage is, for BCD type processes, relatively low. The breakdown current is collected by the two $n^+$ type deep diffusions (sinkers) 8 and 9 (FIG. 7C) and is then sent, across the $n^+$ type buried layer 1, to the highly resistive n type (epi) zone devoid of buried layer underlying the $p^+$ type diffusion 10. The voltage drop across this resistor (r) produces the forward bias of the $p^+/n^-$(epi) junction between the region 10 and the epitaxial layer 3. In this way, there are injections of holes into the epitaxial layer 3 which are then collected by the p type region 12 which acts as the collector region of the lateral pnp transistor. A large portion of the discharge current is hence transported to ground by the lateral pnp transistor. The Zener diode constituted by the junction between the regions 16 and 12 conducts only the base current of the lateral pnp transistor, plus the current for biasing the junction between the region 10 and the epitaxial layer 3. This reduction in the current density across the Zener junction is essential, this junction being an element very sensitive to the electrostatic discharge. To further reduce the concentration of the breakdown current in the curved zone of the Zener junction, steps can be taken, as in the example illustrated, to form the edge of the n+ diffusion 16 on a lighter p type diffusion region (e.g. p well) than the p type region 12 underlying the flat zone of the n+ type diffusion 16. It is moreover preferable to extend the metallization layer 11 connected to the pad so as to completely shield the underlying n+/p Zener junction, in this way producing a fieldplate capable of further inhibiting breakdown in the curved region of the (n+/p−) junction.

During a negative discharge on the pad, the collector/substrate junction, i.e. the n+ diffusions and the n+ type buried layer are forward biased with respect to the p type substrate 2, which is commonly connected to ground. The discharge current is directed to ground across this relatively wide forward biased junction.

The protection structure illustrated in FIGS. 7A, 7B and 7C can be integrated easily as part of a typical process sequence for BCD ( bipolar CMOS and DMOS) type integrated circuits for voltages between 50 and 100V, which sequence can be summarized as follows:

1. p type substrate.
2. n+type buried layer (diffusion of antimony).
3. n type epitaxial growth (phosphorus).
4. $p^{30}$ type isolation (top isolation) (implantation of boron).
5. $n^{30}$ sinker (deep diffusion of phosphorus).
6. p well (light implantation of boron, optimized region such as body region for NMOS transistors).
7. p+ (heavier implantation of boron, used for emitter and collector contacts of pnps).
8. p body (intermediate dose implantation of boron, used for DMOS, NMOS bodies).
9. n+ (heavy and superficial implantation of arsenic used for NMOS source and drain regions and for npn collector and emitter contacts).

The new integrated structure for discharge protection combines the relatively low clamp voltage of the n+/p body Zener with the intrinsic robustness in conduction of a pnp transistor.

Moreover, the current which crosses the n+/p body Zener cannot cause, however much it may be raised, the so-called Zener "zapping" phenomenon. This phenomenon consists of the electrothermal migration of the aluminum in contact with the n+ diffusion, with the consequent formation of a horizontal aluminum channel which goes as far as to perforate the Zener junction, short-circuiting it. In the structure of the invention, no aluminum is present above the n+ region, thus excluding the possibility of perforation of the junction by aluminum spikes. The Zener diode is moreover constructed in such a way as to reduce the concentration of the current in the curved zone of the junction. The above circuit and its physical layout thus overcome many of the drawbacks of the prior art.

I claim:

1. An integrated structure for protection from overvoltages of an external electrical connection pad of a circuit integrated in an n− type conductivity epitaxial layer formed on a monocrystal semiconductor, which comprises an n+ type buried layer formed in a first area at the interface of said n− type epitaxial layer and the semiconductor crystal substrate at a certain distance from the projection of the area of said pad;

a first n+ type deep diffusion region formed in a middle zone of said separation distance between the respective areas of said pad and of said buried layer;

at least one second n+ type deep diffusion region formed along a side of said buried layer substantially orthogonal relative to the side turned towards said pad, and extending between the buried layer and the surface of the epitaxial layer;

a first p+ type conductivity diffused region constituting an emitter region of a lateral pnp transistor and formed adjacent to said first n+ type deep diffusion region along the side of the latter turned towards said buried layer, and electrically contacted in common with said first n+ type deep diffusion region by a metallization layer of said pad;

at least one second p type conductivity diffused region constituting a collector region of said pnp transistor, the base region of which is constituted by said epitaxial layer, functionally separated from said first p+ type conductivity diffused region;

at least one third collector contact p+ type conductivity diffused region, functionally formed at one end of said second p type region and contacted by a ground metallization layer;

at least one n+ type conductivity superficial diffusion region formed by inverting the type of conductivity, in a superficial portion of said second p type conductivity diffused region and extending laterally into said second n+ type deep diffusion region in order to establish, across the latter, an electrical contact path across said buried layer and across said first n+ deep diffusion region with said metallization layer of said pad, comprising a resistive path constituted by the separation zone in said epitaxial layer between the perimeter of said buried layer and a base of said first n+ type deep diffusion region;

the junction between said n+ type conductivity superficial diffusion region and said second p type conductivity diffused region constituting a Zener diode connected between the collector and the base of said lateral pnp transistor.

2. The integrated structure as claimed in claim 1, wherein a further p− type conductivity diffusion region is present between said second p type conductivity diffused region and said third p+ type conductivity diffused region and is, at least partially, overlain by said n+ type conductivity superficial diffusion region, and said metallization layer of the pad extends over a dielectric insulating layer into an area overlying said Zener junction in order to form a field plate for inhibiting breakdown of the Zener junction.

3. The structure as claimed in claim 1, wherein the electrical contact path of said n+ type superficial diffusion layer and said n+ type buried layer comprises a third n+ type conductivity deep diffusion region formed along a side of said buried layer opposite the side along which is formed said second n+ type conductivity deep diffusion region.

4. The integrated structure as claimed in claim 2, wherein a second n+ type conductivity superficial diffusion region is formed in the superficial portion of said first n+ type deep diffusion region and is contacted in common with said first p+ type conductivity diffused region by said metallization layer of said pad.

5. An integrated structure for protection from overvoltages of an external electrical connection pad of a circuit integrated in a p⁻ type conductivity epitaxial layer formed on a monocrystal semiconductor, which comprises a p+ type buried layer formed in a first area at the interface of said p⁻ type epitaxial layer and the semiconductor crystal substrate at a certain distance from the projection of the area of said pad;

a first p+ type deep diffusion region formed in a middle zone of said separation distance between the respective areas of said pad and of said buried layer;

at least one second p$^{30}$ type deep diffusion region formed along a side of said buried layer substantially orthogonal relative to the side turned towards said pad, and extending between the buried layer and the surface of the epitaxial layer;

a first n+ type conductivity diffused region constituting an emitter region of a lateral npn transistor and formed adjacent to said first p+ type deep diffusion region along the side of the latter turned towards said buried layer, and electrically contacted in common with said first p+ type deep diffusion region by a metallization layer of said pad;

at least one second n type conductivity diffused region constituting a collector region of said npn transistor, the base region of which is constituted by said epitaxial layer, functionally separated from said first n+ type conductivity diffused region;

at least one third collector contact n+ type conductivity diffused region, functionally formed at one end of said second n type region and contacted by a ground metallization layer;

at least one p+ type conductivity superficial diffusion region formed by inverting the type of conductivity, in a superficial portion of said second n type conductivity diffused region and extending laterally into said second p+ type deep diffusion region in order to establish, across the latter, an electrical contact path across said buried layer and across said first p+ deep diffusion region with said metallization layer of said pad, comprising a resistive path constituted by the separation zone in said epitaxial layer between the perimeter of said buried layer and a base of said first p+ type deep diffusion region;

the junction between said p+ type conductivity superficial diffusion region and said second n type conductivity diffused region constituting a Zener diode connected between the collector and the base of said lateral pnp transistor.

6. The integrated structure as claimed in claim 5, wherein a further n⁻ type conductivity diffusion region is present between said second n type conductivity diffused region and said third n+ type conductivity diffused region and is, at least partially, overlain by said p+ type conductivity superficial diffusion region, and said metallization layer of the pad extends over a dielectric insulating layer into an area overlying said Zener junction in order to form a field plate for inhibiting breakdown of the Zener junction.

7. The structure as claimed in claim 5, wherein the electrical contact path of said p+ type superficial diffusion layer and said p+ type buried layer comprises a third p+ type conductivity deep diffusion region formed along a side of said buried layer opposite the side along which is formed said second p+ type conductivity deep diffusion region.

8. The integrated structure as claimed in claim 5, wherein a second p+ type conductivity superficial diffusion type deep diffusion region and is contacted in common with said first n+ type conductivity diffused region by said metallization layer of said pad.

9. A circuit for protection from overvoltages of an external electrical connection pad of a circuit integrated in an epitaxial layer having a first conductivity type formed on a monocrystal semiconductor substrate, which comprises a lateral integrated transistor having an emitter connected to said pad, a collector connected to ground and a base connected to said pad across a resistor, and an integrated Zener diode functionally connected between the base and the collector of said transistor, wherein said resistor is provided by a resistive path extending between a deep first diffusion having the first conductivity type and coupled to said pad and a second diffusion having the first conductivity type in a lower portion of the epitaxial layer adjacent to a substrate of a second conductivity type, said epitaxial layer being more lightly doped than said deep first diffusion to form a resistive path by the spacing between said two diffusions.

10. The circuit according to claim 9 wherein the collector of said lateral transistor is coupled to an electrically common region of semiconductor as one terminal of said Zener diode to provide an alternate current path from said pad through said lateral transistor to ground rather than through said Zener diode.

11. The circuit according to claim 10 wherein said electrically common region in semiconductor includes a doped region of the second conductivity type, said collector and said one terminal of said Zener diode both being within the very same physical region to ensure that they are electrically in common.

12. The circuit according to claim 9 wherein a static discharge path is provided through an emitter to collector current path of the lateral transistor, the collector being coupled to ground and the emitter to the pad and the base being biased to turn on the transistor via the resistor connected from said base to said pad.

13. The circuit according to claim 9 wherein said emitter includes a diffused region of the second conductivity type coupled to said pad and wherein said pad includes a unitary metallization layer overlaying both said diffused region of the second conductivity type and said first diffusion to electrically connect them together.

14. The circuit according to claim 13 wherein said diffused region of the second conductivity type and said first diffusion are immediately adjacent each other, with said first diffusion extending deeper into the epitaxial layer than said diffused region of the second conductivity type, the first diffusion forming one terminal of the resistor coupled to the base of the lateral transistor.

15. The circuit according to claim 14 wherein said electrically common region in semiconductor includes a doped region of a second conductivity type, said collector and said one terminal of said Zener diode both being within the very same physical region to ensure that they are electrically in common.

16. A circuit for protection from overvoltages of an external electrical connection pad of a circuit integrated in an epitaxial layer having a first conductivity type formed on a monocrystal semiconductor substrate, which comprises a lateral integrated transistor having an emitter connected to said pad, a collector connected to ground and a base connected to said pad across a resistor, and an integrated Zener diode functionally connected between the base and the collector of said transistor, wherein a single metallization layer extends over a region of said Zener diode, the Zener diode being in a semiconductor region below an oxide layer and the single metallization layer overlaying said oxide layer to further protect said Zener diode.

17. The circuit according to claim 16 wherein the collector of said lateral transistor is coupled to an electrically common region of semiconductor as one terminal of said Zener diode to provide an alternate current path from said pad, through said lateral transistor to ground rather than through said Zener diode.

18. The circuit according to claim 16 wherein a static discharge path is provided through an emitter to collector current path of the lateral transistor, the collector being coupled to ground and the emitter to the pad and the base being biased to turn on the transistor via the resistor connected from said base to said pad.

19. The circuit according to claim 18 wherein said emitter includes a diffused region of a second conductivity type coupled to said pad and said resistor includes a diffused region of the first conductivity type coupled to said pad and wherein said pad includes a unitary metallization layer overlaying both said diffused region of the second conductivity type and said diffused region of the first conductivity type to electrically connect them together.

20. The circuit according to claim 19 wherein said diffused region of the second conductivity type and said diffused region of the first conductivity type are immediately adjacent each other, with said diffused region of the first conductivity type extending deeper into the epitaxial layer than said diffused region of the second conductivity type, the diffused region of the first conductivity type forming one terminal of the resistor coupled to the base of the lateral transistor.

* * * * *

UNITED STATES PATENT AND TRADEMARK OFFICE
CERTIFICATE OF CORRECTION

PATENT NO. : 5,223,737
DATED : June 29, 1993
INVENTOR(S) : Athos Canclini

It is certified that error appears in the above-indentified patent and that said Letters Patent is hereby corrected as shown below:

In column 7, claim 5, line 14, please delete "$p^{30}$" and substitute therefor --$p^+$--.

In column 8, claim 8, lines 4 and 5, after "superficial diffusion" and before "type deep", please insert --region is formed in the superficial portion of said first $p^+$--.

Signed and Sealed this

Twenty-ninth Day of March, 1994

BRUCE LEHMAN

Attest:

Attesting Officer    Commissioner of Patents and Trademarks